(12) United States Patent
Kurita et al.

(10) Patent No.: US 7,086,638 B2
(45) Date of Patent: Aug. 8, 2006

(54) METHODS AND APPARATUS FOR SEALING AN OPENING OF A PROCESSING CHAMBER

(75) Inventors: Shinichi Kurita, San Jose, CA (US); Ke Ling Lee, Cupertino, CA (US); Wendell T Blonigan, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/844,974

(22) Filed: May 12, 2004

(65) Prior Publication Data

US 2004/0245489 A1 Dec. 9, 2004

Related U.S. Application Data

(60) Provisional application No. 60/470,140, filed on May 13, 2003.

(51) Int. Cl.
*F16K 51/02* (2006.01)
(52) U.S. Cl. .................. 251/199; 251/175; 251/195
(58) Field of Classification Search ............. 251/175, 251/195–202
See application file for complete search history.

(56) References Cited

U.S. PATENT DOCUMENTS

| | | | |
|---|---|---|---|
| 2,184,892 A * | 12/1939 | Dickinson | 251/195 |
| 3,040,773 A | 6/1962 | McInerney | |
| 3,152,786 A * | 10/1964 | Soderberg et al. | 251/167 |
| 3,524,467 A | 8/1970 | Worley | |
| 3,717,322 A | 2/1973 | Bernard | |
| 3,785,612 A | 1/1974 | Schertler | |
| 4,052,036 A | 10/1977 | Schertler | |
| 4,070,001 A | 1/1978 | Musgrove | |
| 4,075,787 A | 2/1978 | Krahe | |
| 4,131,131 A | 12/1978 | Frisch | |
| 4,157,169 A | 6/1979 | Norman | |
| 4,164,211 A | 8/1979 | Onnen | |
| 4,238,111 A | 12/1980 | Norman | |
| 4,343,455 A | 8/1982 | Winkler | |
| 4,359,203 A * | 11/1982 | Cho | 251/77 |
| 4,381,100 A | 4/1983 | Schoenberg | |

(Continued)

FOREIGN PATENT DOCUMENTS

DE   2639198 A1   3/1978

(Continued)

OTHER PUBLICATIONS

VAT Series 19 Large Gate Valves Data Sheet, pp. 60-61.

(Continued)

*Primary Examiner*—J. Casimer Jacyna
(74) *Attorney, Agent, or Firm*—Dugan & Dugan

(57) ABSTRACT

In one embodiment, a slit valve is provided that is adapted to seal an opening and that includes a valve housing having a first wall, a first opening formed in the first wall, a second wall and a second opening formed in the second wall. The slit valve also includes a closure member having a sealing portion adapted to contact the second wall and seal the second opening, and a bracing member moveable relative to the sealing portion and adapted to contact the first wall. The slit valve further includes at least one actuating mechanism adapted to (1) move the sealing portion toward the second wall and into contact with the second wall; and (2) move the bracing member away from the sealing portion and into contact with the first wall so as to brace the sealing portion against the second wall. Numerous other aspects are provided.

34 Claims, 14 Drawing Sheets

U.S. PATENT DOCUMENTS

| | | |
|---|---|---|
| 4,412,671 A | 11/1983 | Tiefenthaler |
| 4,562,992 A | 1/1986 | Sugisaki et al. |
| 4,721,282 A | 1/1988 | Shawver et al. |
| 4,763,602 A | 8/1988 | Madan et al. |
| 4,785,962 A | 11/1988 | Toshima |
| 4,921,213 A | 5/1990 | Geiser |
| 5,002,255 A | 3/1991 | Sawa et al. |
| 5,087,017 A | 2/1992 | Sawa et al. |
| 5,110,249 A | 5/1992 | Norman |
| 5,116,023 A | 5/1992 | Contin |
| 5,120,019 A | 6/1992 | Davis, Jr. |
| 5,163,478 A | 11/1992 | de Fries |
| 5,169,125 A | 12/1992 | Bailey |
| 5,226,632 A | 7/1993 | Tepman et al. |
| 5,275,303 A | 1/1994 | Szalai |
| 5,363,872 A | 11/1994 | Lorimer |
| 5,379,983 A | 1/1995 | Geiser |
| 5,560,586 A | 10/1996 | Aruga et al. |
| 5,577,707 A | 11/1996 | Brida |
| 5,597,184 A | 1/1997 | Brenes et al. |
| 5,626,324 A | 5/1997 | Nakamura et al. |
| 5,695,564 A | 12/1997 | Imihashi |
| 5,735,339 A | 4/1998 | Davenport et al. |
| 5,791,632 A | 8/1998 | Brenes |
| 5,820,104 A | 10/1998 | Koyano et al. |
| 5,881,998 A | 3/1999 | Brenes |
| 5,884,899 A | 3/1999 | Brenes |
| 5,971,358 A | 10/1999 | Kennedy |
| 5,975,492 A | 11/1999 | Brennes |
| 5,980,194 A | 11/1999 | Freerks et al. |
| 6,032,419 A | 3/2000 | Hurwitt |
| 6,045,620 A | 4/2000 | Tepman et al. |
| 6,079,693 A | 6/2000 | Ettinger et al. |
| 6,089,543 A | 7/2000 | Freerks |
| 6,105,435 A | 8/2000 | French, Jr. |
| 6,173,938 B1 | 1/2001 | McAndrew |
| 6,192,827 B1 | 2/2001 | Welch et al. |
| 6,293,306 B1 | 9/2001 | Brenes |
| 6,302,372 B1 | 10/2001 | Sauer et al. |
| 6,347,918 B1 | 2/2002 | Blahnik |
| 6,390,448 B1 | 5/2002 | Kroeker et al. |
| 6,427,973 B1 | 8/2002 | Wagner |
| 6,443,426 B1 | 9/2002 | Brenes |
| 6,561,484 B1 * | 5/2003 | Nakagawa et al. .......... 251/175 |
| 6,905,107 B1 | 6/2005 | Blahnik |

FOREIGN PATENT DOCUMENTS

| | | |
|---|---|---|
| DE | 44 14 176 A1 | 10/1995 |
| EP | 0 441 646 A1 | 8/1991 |
| EP | 0 684 415 A1 | 11/1995 |
| FR | 2363746 | 3/1978 |
| GB | 851444 | 10/1960 |
| GB | 2240157 A | 7/1991 |
| WO | WO 99/03132 | 1/1999 |
| WO | WO 99/28951 | 6/1999 |
| WO | WO 02/008484 A3 | 1/2002 |
| WO | WO 2004/102055 A1 | 11/2004 |

OTHER PUBLICATIONS

VAT Series 48 All-Metal Gate Valve Data Sheet, pp. 106-107.

VAT Series 12 Vacuum Gate Valve Data Sheet, pp. 40-41.

Brenes, Arthur, et al., "HVA", <http://www.avem.org/MemDirF/HVA.html>, pp. 1-2, printed on Jan. 23, 2003.

* cited by examiner

METHODS AND APPARATUS FOR SEALING AN OPENING OF A PROCESSING CHAMBER

The present application claims priority from U.S. Provisional Patent Application Ser. No. 60/470,140, filed May 13, 2003, which is hereby incorporated by reference herein in its entirety.

FIELD OF THE INVENTION

The present invention relates generally to semiconductor device manufacturing and more particularly to methods and apparatus for sealing an opening of a processing chamber.

BACKGROUND OF THE INVENTION

A substrate processing chamber typically communicates with a substrate transfer chamber through a sealable opening that is both wide and relatively short to accommodate insertion and removal of horizontally-oriented substrates. It is known to use a slit valve to seal such an opening. For example, a sealing plate of the slit valve may be extended to seal the opening, and retracted to permit passage of substrates through the opening. Slit valve designs that avoid the problems of (1) particle generation through rubbing friction, and (2) uneven compression of resilient sealing elements, are preferred.

During certain types of substrate processing steps, a pressure differential may exist between the processing chamber and the transfer chamber such that high pressure within the processing chamber pushes outward against the sealing plate of the slit valve. The slit valve thereby is subjected to stresses and fatigue, the amounts of which increase with the pressure differential. Pressure differential effects are exacerbated when large substrates, such as those employed for flat panel displays, are involved (e.g., as a larger substrate requires a larger opening between the processing chamber and transfer chamber and a larger sealing plate to seal such an opening). Conventional slit valves typically are not designed to accommodate large pressure differentials. Accordingly, a need exists for improved methods and apparatus for sealing an opening of a processing chamber, particularly when large pressure differentials are being employed.

SUMMARY OF THE INVENTION

In a first embodiment of the invention, a slit valve is provided that is adapted to seal an opening. The slit valve includes a valve housing having (1) a first wall; (2) a first opening formed in the first wall; (3) a second wall; and (4) a second opening formed in the second wall. The slit valve also includes a closure member having a sealing portion adapted to contact the second wall and seal the second opening, and a bracing member moveable relative to the sealing portion and adapted to contact the first wall. The slit valve further includes at least one actuating mechanism adapted to (1) move the sealing portion toward the second wall and into contact with the second wall; and (2) move the bracing member away from the sealing portion and into contact with the first wall so as to brace the sealing portion against the second wall.

In a second embodiment of the invention, a method of sealing an opening is provided. The method includes providing a valve housing having (1) a first wall; (2) a first opening formed in the first wall; (3) a second wall; and (4) a second opening formed in the second wall. The method further includes providing a closure member having a sealing portion adapted to contact the second wall and seal the second opening, and a bracing member moveable relative to the sealing portion and adapted to contact the first wall. The method also includes (1) moving the sealing portion toward the second wall and into contact with the second wall; and (2) moving the bracing member away from the sealing portion and into contact with the first wall so as to brace the sealing portion against the second wall. Numerous other aspects are provided.

Other features and aspects of the present invention will become more fully apparent from the following detailed description, the appended claims and the accompanying drawings.

DETAILED DESCRIPTION

Figure 1A:
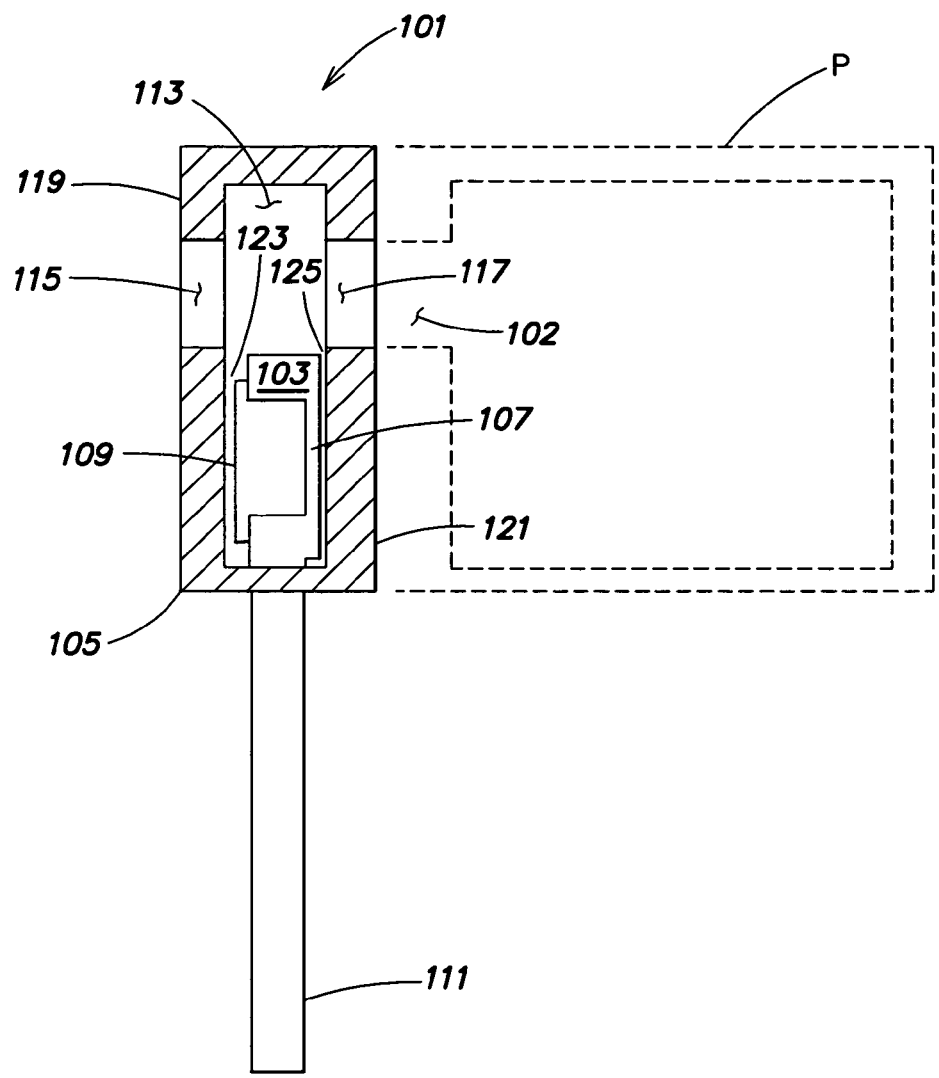
FIGS. 1A–1C illustrate an embodiment of an apparatus in accordance with the present invention comprising a chamber isolation valve.
Figure 1B:
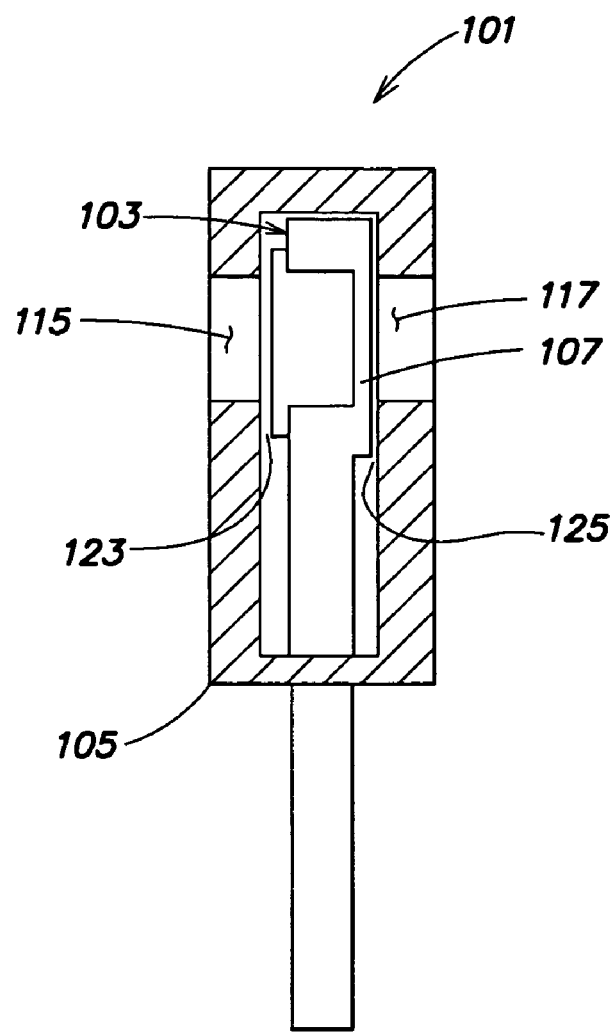
Figure 1C:
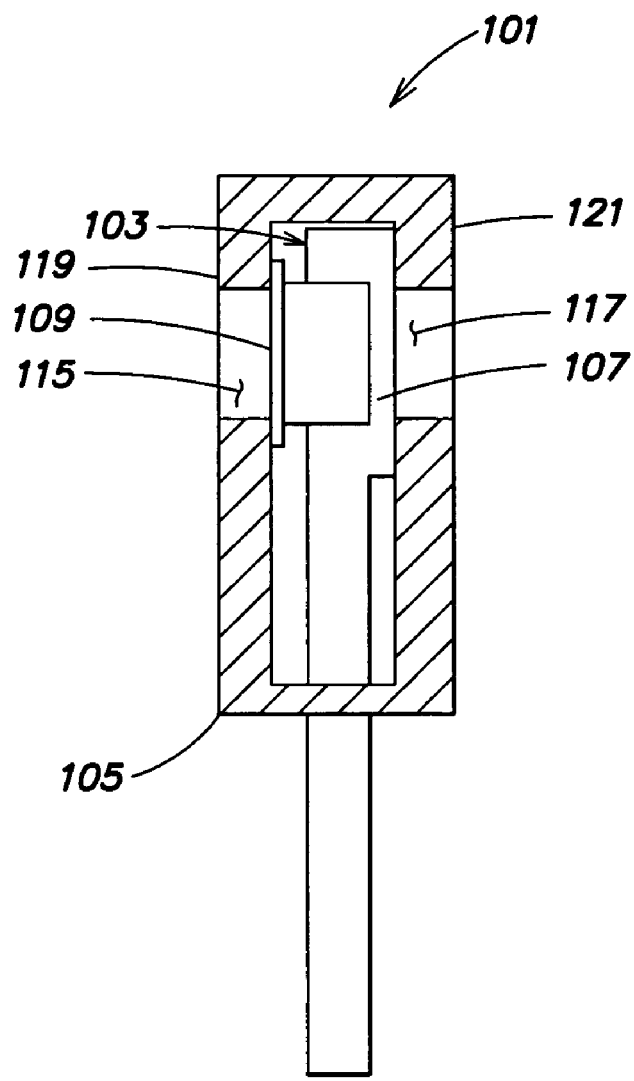

FIGS. 1A–1C illustrate an embodiment of an apparatus in accordance with the present invention comprising a chamber isolation valve 101. Also, when considered in light of the discussion below, FIGS. 1A–1C illustrate an embodiment of an inventive method for using the chamber isolation valve 101 to seal an opening 102 (shown in phantom in FIG. 1A) to an adjacent processing chamber P (shown in phantom in FIG. 1A) so as to permit pressurization of the processing chamber P for processing of a substrate contained therein.

The chamber isolation valve 101 may include a closure member 103 for sealing the processing chamber opening 102. In addition, the chamber isolation valve 101 may comprise a valve housing 105 within which at least a portion of the closure member 103 may be movably disposed. To permit the chamber isolation valve 101 to be used in conjunction with an opening of a processing chamber, the valve housing 105 of the chamber isolation valve 101 may be placed against the processing chamber, e.g. such that a seal (not shown) is formed between the valve housing 105 and the processing chamber around the processing chamber opening to be sealed.

The closure member 103 may include a sealing portion 107 for sealing the processing chamber opening 102. For example, the sealing portion 107 may be utilized so as to seal the processing chamber opening 102 indirectly, e.g., by sealing an opening to the valve housing 105 that is aligned with the processing chamber opening 102. Alternatively, the sealing portion 107 may be placed in direct contact (not shown) with the processing chamber P such that the sealing portion 107 seals around the processing chamber opening 102.

The closure member 103 may further include a bracing member 109 that is movable relative to the sealing portion 107. For example, the bracing member 109 may be adapted to extend away from and retract toward the sealing portion 107. Further, the bracing member 109 may be adapted to brace or buttress the sealing portion 107, for example, when the sealing portion 107 is in position to seal the processing chamber opening 102 as described above. Such an arrangement is inherently efficient in that it may decrease and/or minimize the amount of force needed to counter a positive pressure within the processing chamber P, especially as compared to commonly-utilized cantilevered arrangements (not shown).

To provide for convenient movement of the closure member 103 relative to the processing chamber opening 102, the closure member 103 may also comprise an extended portion 111 extending from the sealing portion 107. In such an embodiment, an end of the extended portion 111 that is spaced away from the sealing portion 107 may be adapted to be grasped and/or manipulated, e.g. by an actuator (see FIG. 2) disposed inside or outside the valve housing 105, so as to enable the closure member 103 to be moved as a unit (e.g. by moving both the sealing portion 107 and the bracing member 109 together via the extended portion 111). For example, the closure member 103 may be moved via the extended portion 111 toward and/or away from the processing chamber opening 102 (transversely between the respective configurations of the chamber isolation valve 101 shown in FIGS. 1B and 1C or longitudinally between the respective configurations of the chamber isolation valve 101 shown in FIGS. 1A and 1B).

Preferably, the extended portion 111 of the closure member 103 is fixed in relation to the sealing portion 107 of the closure member 103. For example, the sealing portion 107 and the extended portion 111 may be of unitary construction as shown in FIG. 1A. Alternatively the extended portion 111 may be fixedly coupled to the sealing portion 107.

The valve housing 105 may define an enclosure 113, a first opening 115 to the enclosure 113, and a second opening 117 to the enclosure 113. Preferably, the first opening 115 and the enclosure 113 are aligned along a common axis with the processing chamber opening 102 and are sized so as to permit passage of substrates through the valve housing 105 and into and out of the processing chamber P. For example, the first opening 115 may be spaced apart from the processing chamber opening 102 and the second opening 117 may be disposed on the other side of the enclosure 113, adjacent the processing chamber opening 102 and on the common axis. In one or more embodiments, the second opening 117 may be placed in pneumatic communication with the processing chamber opening 102 such that the second opening 117 essentially comprises an extension of the processing chamber opening 102.

The valve housing 105 may further comprise a rear plate 119 within which the first opening 115 is formed. The rear plate 119 may be adapted, and appropriately located, so as to permit the bracing member 109 to contact the rear plate 119 and push against the rear plate 119 for bracing the sealing portion 107 of the closure member 103 during sealing (as described further below).

The valve housing 105 may further comprise a front plate 121 within which the second opening 117 is formed. The front plate 121 may be adapted, and appropriately located, so as to permit the sealing portion 107 of the closure member 103 to contact the front plate 121 and seal around the second opening 117. Alternatively, as discussed above, the sealing portion 107 may directly contact the processing chamber P to seal the opening 102.

In operation, as shown in FIG. 1A, the closure member 103 of the chamber isolation valve 101 is adapted to assume a retracted position relative to the first and second openings 115, 117 wherein the closure member 103 is spaced away from (e.g., below) the first and second openings 115, 117. Such a configuration permits substrates to be passed through the valve housing 105 and into and out of the processing chamber P.

As shown in FIG. 1A, in at least one embodiment, the enclosure 113 of the valve housing 105 may enclose the sealing portion 107 of the closure member 103 while still permitting passage of substrates through the valve housing 105. Also as shown in FIG. 1A, the enclosure 113 of the valve housing 105 may enclose the sealing portion 107 and the bracing member 109 with space to spare, e.g. so as to provide a first gap 123 between the bracing member 109 and the rear plate 119, and a second gap 125 between the sealing portion 107 and the front plate 121.

The closure member 103 may be moved relative to the valve housing 105 so as to assume a deployed position relative to the first and second openings 115, 117 as shown in FIG. 1B wherein the sealing portion 107 is disposed between the first and second openings 115, 117. Preferably during such deployment, the first and second gaps 123, 125 are maintained so as to reduce and/or eliminate particle-generating friction and/or rubbing that might otherwise arise between the closure member 103 and the valve housing 105. It will now be apparent that substrates (not shown) may no longer be passed through the valve housing 105, since the closure member 103 blocks the path therethrough.

The closure member 103, which in FIG. 1B is shown in a retracted position relative to the second opening 117 of the valve housing 105, may be moved into a deployed position relative to the second opening 117 as shown in FIG. 1C. As shown in FIG. 1C, the sealing portion 107 of the closure member 103 is in contact with the front plate 121, and may be caused to seal the second opening 117 of the valve housing 105. Preferably, and as demonstrated by the chamber isolation valve 101 shown in FIGS. 1B and 1C, relative motion between the sealing portion 107 of the closure member 103 and the front plate 121 of the valve housing 105 leading to sealing of the second opening 117 is restricted to a direction that is normal to front plate 121, so as to reduce and/or eliminate the potential for particle generation via friction.

As may also be seen by comparing FIG. 1C to FIG. 1B, the chamber isolation valve 101 may be adapted to generate a separation force that moves the bracing member 109 relative to the sealing portion 107 so as to cause the bracing member 109 to move away from the processing chamber opening 102 (FIG. 1) and into contact with the rear plate 119 of the valve housing 105. Alternatively, the bracing member 109 may be caused to contact a portion of the transfer chamber (not shown), or another structural member. The chamber isolation valve 101 may then generate a bracing force, also tending to urge the bracing member 109 away from the sealing portion 107, so as to brace or buttress the sealing portion 107 of the closure member 103 against the front plate 121 of the valve housing 105, or against the processing chamber P (FIG. 1), as the case may be. Such a bracing force may be generated in any number of ways and at any number of locations relative to the closure member 103. For example, the bracing force may be both generated and applied directly between the bracing member 109 and the sealing portion 107, e.g. by a pneumatic actuator (see FIG. 2) disposed or formed therebetween. Note that in at least one embodiment of the invention, the bracing member 109 does not seal the first opening 115.

Figure 2:
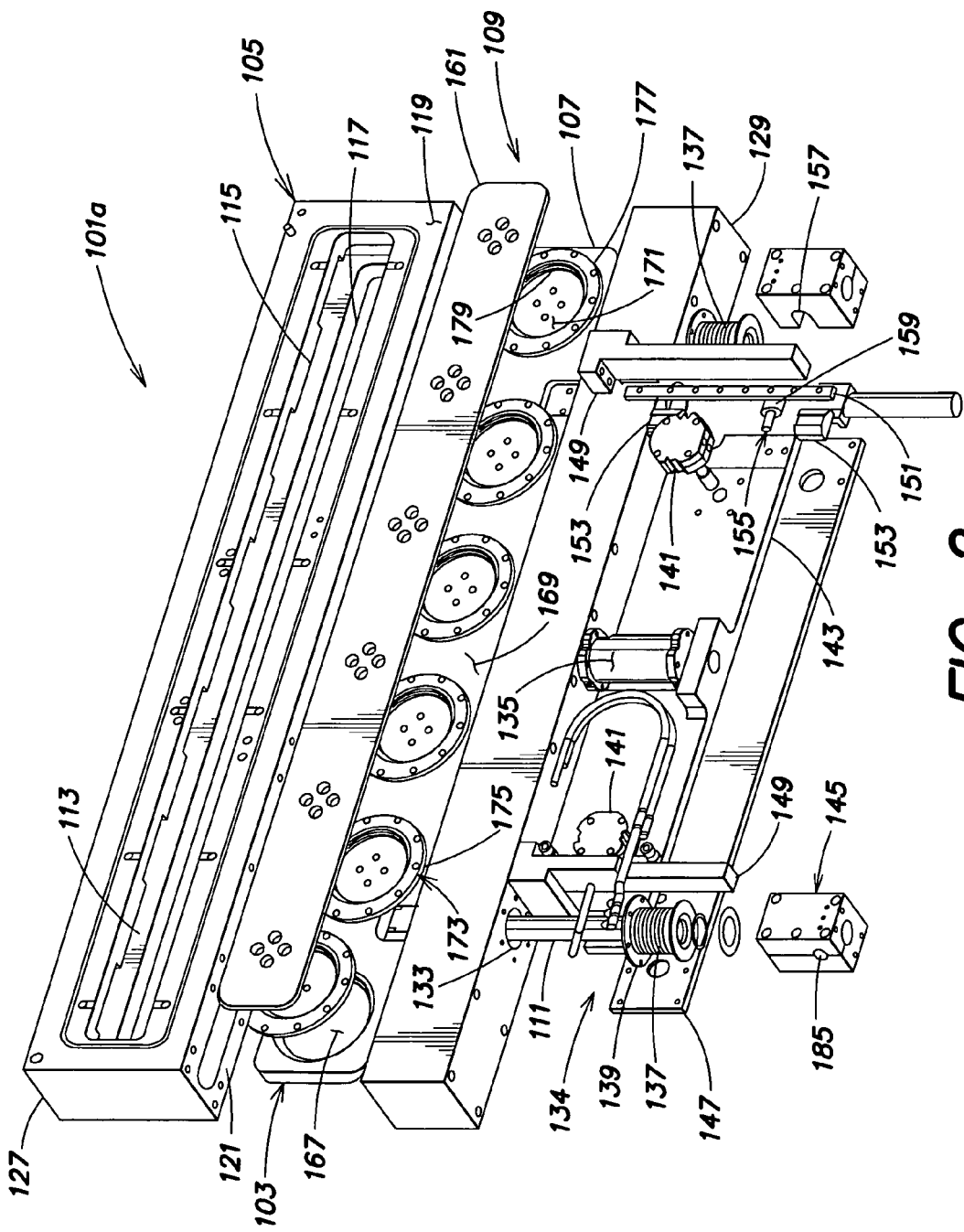
FIG. 2 is a perspective exploded assembly view of an inventive chamber isolation valve representing an exemplary embodiment of the chamber isolation valve of FIGS. 1A–1C.

FIG. 2 is a perspective exploded assembly view of an inventive chamber isolation valve 101a representing an exemplary embodiment of the chamber isolation valve 101 of FIGS. 1A–1C. FIGS. 3A–3F are sectional assembly side views of the chamber isolation valve 101a taken at various locations along a length of the chamber isolation valve 101a and which describe structural and operational aspects of the chamber isolation valve 101a. Structural and functional descriptions appearing above with reference to the chamber isolation valve 101 therefore also apply to the chamber isolation valve 101a, with similar reference numerals being used to indicate corresponding aspects (e.g., of structure) in the figures.

Figure 3A:
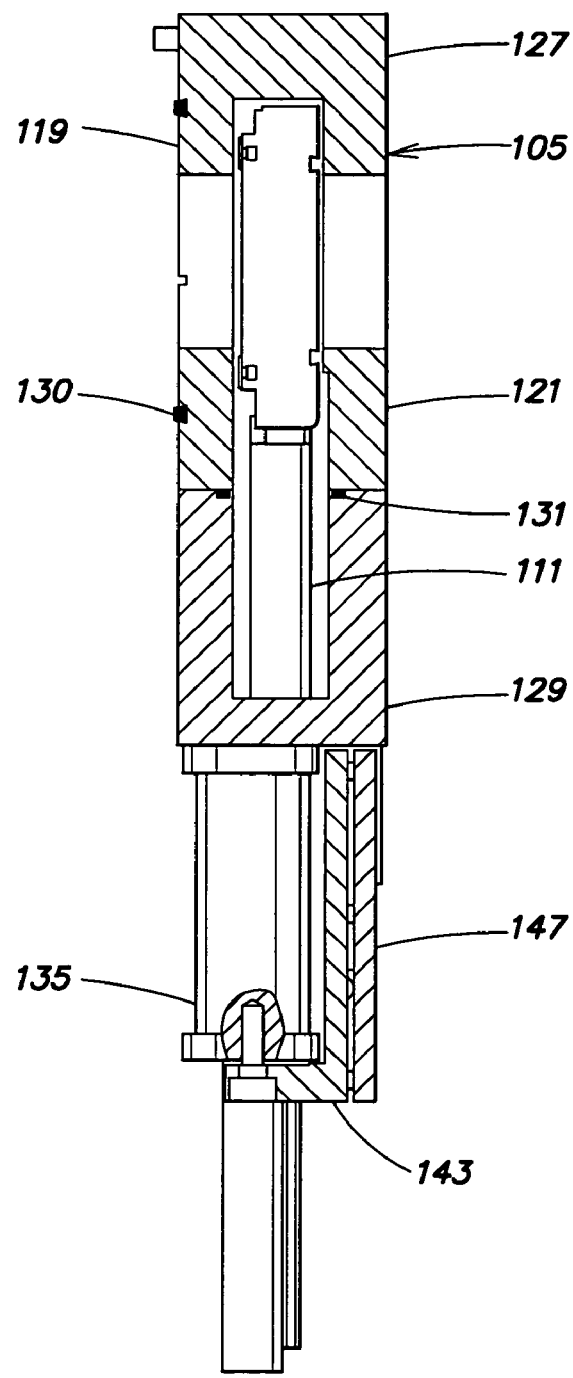
FIGS. 3A–3F are sectional assembly side views of the chamber isolation valve of FIG. 2 taken at various locations along a length of the chamber isolation valve.

Referring to FIGS. 2 and 3A, the valve housing 105 may comprise an upper portion 127 and a lower portion 129 that is coupled to the upper portion 127. The upper portion 127 may include a resilient element 130 (FIG. 3A) so as to permit the rear plate 119 of the valve housing 105 to be sealed against an external corresponding structure, such as a valve interface portion of a transfer chamber (not shown). The lower portion 129 may include resilient element 131 (FIG. 3A) for sealing the lower portion 129 of the valve housing 105 against the upper portion 127 of the valve housing 105. The lower portion 129 may further include a first and a second port 133 (FIGS. 2 and 3D) adapted to permit an extended portion 111 of the closure member 103 to extend outward of the valve housing 105 and to permit both longitudinal (e.g. vertical) and transverse (e.g. horizontal) movement of the closure member 103 relative to the valve housing 105. More or fewer ports 133 may be specified as necessary or as desired.

Referring to FIG. 2, the closure member 103 includes two extended portions 111, each extended portion 111 being coupled to the sealing portion 107, and the chamber isolation valve 101a being configured such that each extended portion 111 extends through a port 133. More or fewer extended portions 111 may be specified as necessary or as desired.

Referring to FIGS. 2 and 3A–3F, the chamber isolation valve 101a may comprise a deployment mechanism 134 for moving the closure member 103, e.g. relative to the valve housing 105 and/or the processing chamber opening 102 (FIG. 1A). For example, the deployment mechanism 134 may include one or more first actuators 135 (FIGS. 2 and 3A) for moving the closure member 103 between longitudinally retracted and longitudinally deployed positions of the closure member 103, shown respectively in FIGS. 3F and 3D. The first actuator 135 may be one of many different types of suitable devices. For example, a pneumatically-driven linear actuator such as is embodied by the first actuator 135 of FIGS. 2 and 3A would be suitable, as would be a belt- or screw-driven actuator.

The deployment mechanism 134 may further comprise one or more external bellows 137 (FIG. 2) for protecting the enclosure 113 (FIG. 3D) of the valve housing 105 against intrusion of contaminants through the ports 133. Each external bellows 137 corresponds to and is adapted to surround a separate extended portion 111 of the closure member 103. Where more or fewer extended portions 111 exist, the number of external bellows 137 may increase or decrease accordingly. Each external bellows 137 may include a first mounting flange 139 mounted to the valve housing 105 around the port 133 through which the corresponding extended portion 111 extends.

Figure 3B:
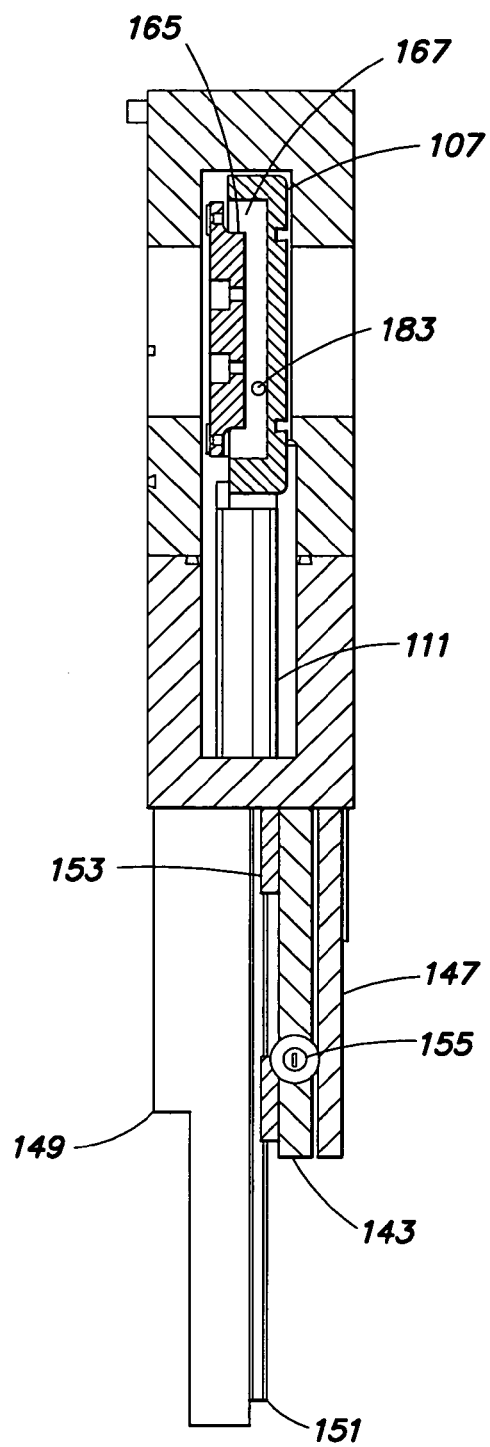
Figure 3C:
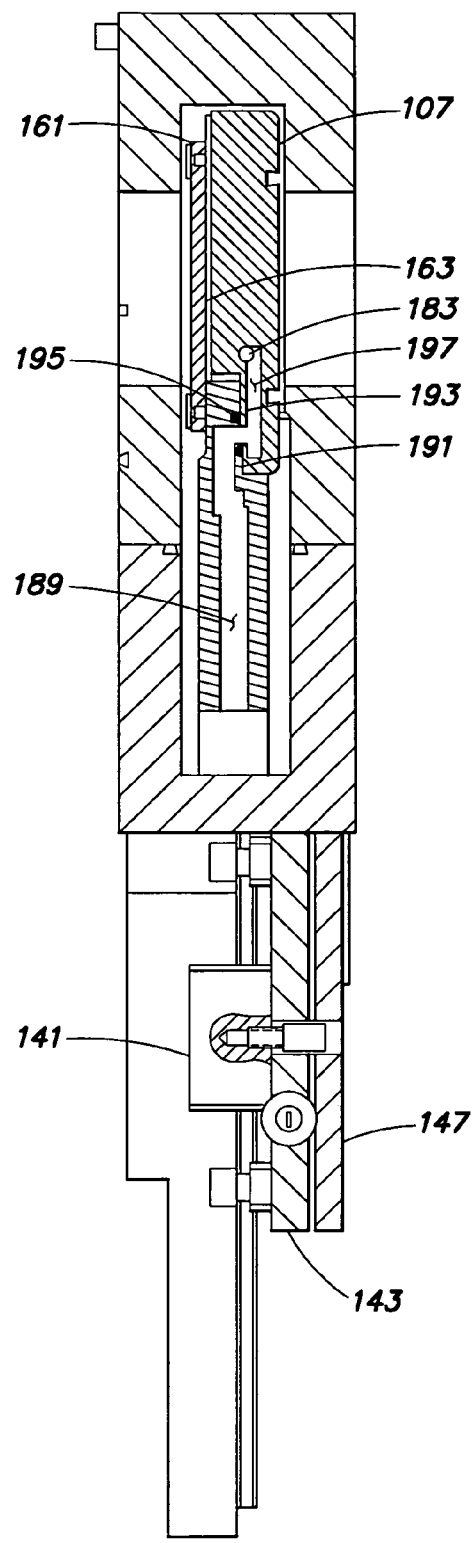
Figure 3D:
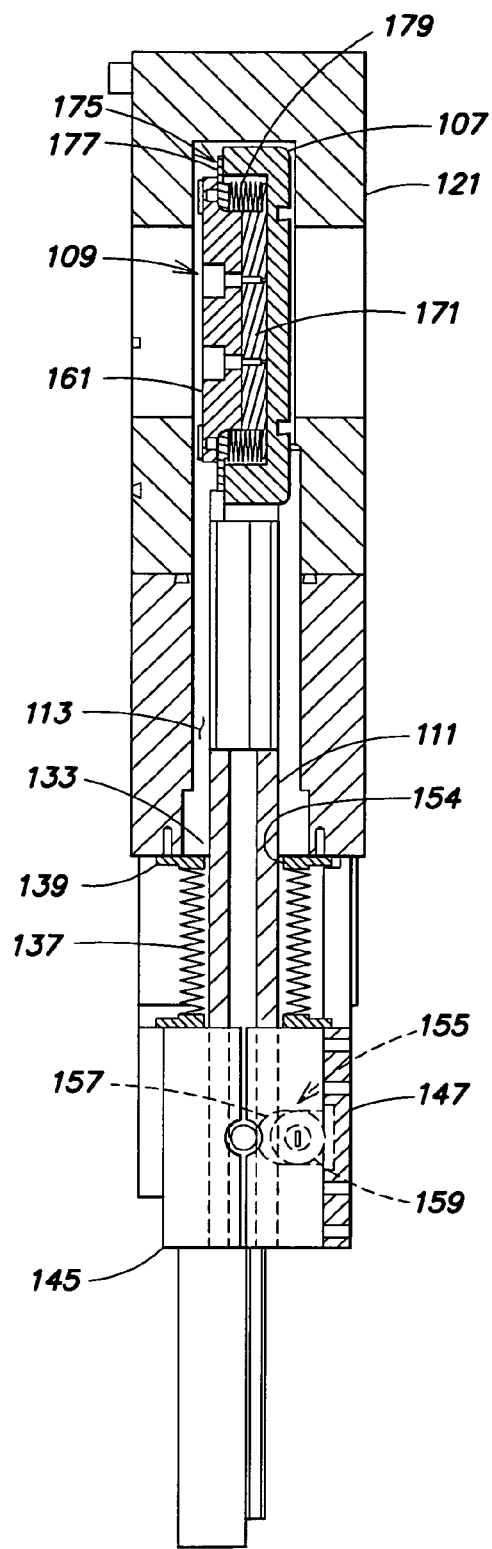
Figure 3E:
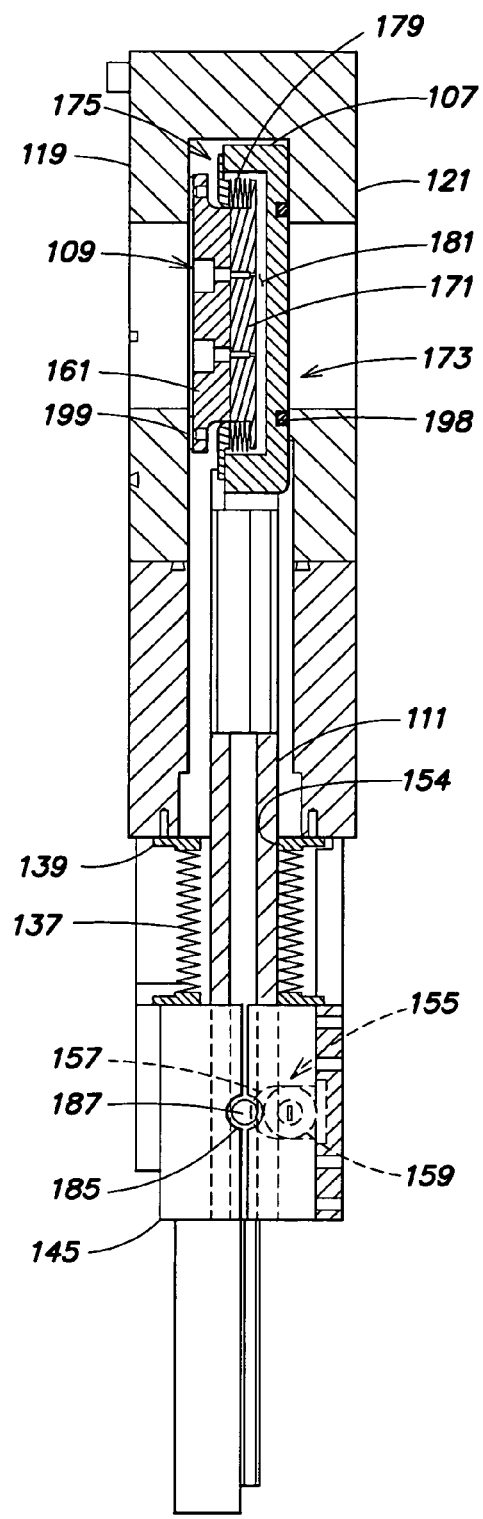

The deployment mechanism 134 may further include one or more second actuators 141 (FIGS. 2 and 3C) for moving the closure member 103 between transversely retracted and transversely deployed positions of the closure member 103, shown respectively in FIGS. 3D and 3E. Each second actuator 141 may be mounted to a first support plate 143 which may in turn be movably mounted to the valve housing 105 via the first actuator 135. Each second actuator 141 may be one of many different suitable devices. For example, a pneumatically-driven linear actuator, such as is embodied by the second actuator 141 of FIGS. 2 and 3C, would be suitable, as would be a belt- or screw-driven actuator.

The deployment mechanism 134 may be adapted to guide the first support plate 143 as the first actuator 135 moves the first support plate 143 longitudinally relative to the valve housing 105. For example, a first and a second support 149 may be affixed to and extend from the valve housing 105, and the first support plate 143 may be slidably coupled to each support 149, e.g., via a rail 151 preferably fixedly coupled to each support 149, and a first and second pair of trucks 153. Each pair of trucks 153 may be fixedly coupled to the first support plate 143 and movably coupled to a rail 151 so as to permit longitudinal movement of the first support plate 143.

Referring to FIGS. 2, 3C and 3D, the deployment mechanism 134 may further include one or more brackets 145, each bracket 145 being secured to an end of a extended portion 111 that is spaced apart from the sealing portion 107 of the closure member 103. The deployment mechanism 134 may also include a second support plate 147, the second support plate 147 being movably mounted to the first support plate 143 (and/or to the valve housing 105) via the second actuator 141. Each bracket 145 may be coupled to the second support plate 147 to provide a means by which the deployment mechanism 134 may manipulate and/or move the closure member 103 (e.g. longitudinally, or transversely, or a combination thereof).

The deployment mechanism 134 may be adapted both to guide the second support plate 147 as the second actuator 141 moves the second support plate 147 transversely relative to the first support plate 143 and the valve housing 105, and to isolate the transversely-operating second actuator 141 from the vertical force represented by the combined weight of the closure member 103, the second support plate 147 and the brackets 145 (e.g. so as to facilitate smooth transverse translation of the closure member 103 relative to the valve housing 105). For example, as shown in FIGS. 2 and 3B, the deployment mechanism 134 may further comprise bearings 155 extending from sides of the first support plate 143, and each bracket 145 may comprise a guide slot 157 adapted to accommodate a roller portion 159 of one of the bearings 155. As such, while the second support plate 147 is moving transversely relative to the first support plate 143, the bearings 155 and the first support plate 143 may be caused to bear substantially all of the weight of the closure member 103, the brackets 145 and the second support plate 147 while still allowing that subassembly to smoothly translate via overturning (rolling) communication between the bearing roller portions 159 and the bracket guide slots 157.

For instances in which the first opening 115 of the valve housing 105 is relatively long, as with the chamber isolation valve 101a of FIG. 2, bracing member 109 may include a brace plate 161 that is similarly elongated. The brace plate 161 may comprise a first side 163 (FIG. 3C) that faces toward the sealing portion 107, on which a plurality of mounting bosses 165 (FIG. 3B) may be provided. Each of the plurality of mounting bosses 165 may be adapted to extend into a respective one of a plurality of pockets 167 (FIG. 2, see also FIG. 3B) formed within a non-sealing side 169 (FIG. 2) of the sealing portion 107. A respective one of an equivalent plurality of drive plates 171 (FIG. 2) may be disposed within each pocket 167 (see FIG. 3D) and coupled, preferably fixedly, to the mounting boss 165 of the brace plate 161 extending therein. A subassembly may thereby be formed comprising the brace plate 161 as well as each drive plate 171 coupled to the brace plate 161 via the mounting bosses 165.

The closure member 103 may be adapted to move the bracing member 109 back and forth between the (transversely) retracted position shown in FIG. 3D and the deployed or extended position shown in FIG. 3E. For example, an actuating device may be employed within the bracing member 109 and/or the sealing portion 107 of the closure member 103 (e.g., so as to only minimally enlarge the overall size of the closure member 103). For instance, the closure member 103 may comprise at least one bracing actuator 173 (FIGS. 2 and 3E) as described below with reference to FIGS. 2 and 3B–3F.

When the first opening 115 is relatively long, as with the chamber isolation valve 101a of FIG. 2, the closure member 103 may include a plurality of bracing actuators 173 (e.g., depending on the magnitude of bracing force that is required to be applied to the sealing portion 107 via the bracing member 109 and/or the room available on the non-sealing side 169 of the sealing portion 107 to form pockets 167). Each bracing actuator 173 may be built into, and/or integrated within the closure member 103 so as to be comprised of portions of some of the components of the closure member 103 already described above (e.g., a pocket 167 of the sealing portion 107, and a drive plate 171 of the bracing member 109). In addition, each bracing actuator 173 may comprise a drive plate bellows 175 (FIG. 3D) that includes a mounting flange 177 coupled to the non-sealing side 169 of the sealing portion 107 (e.g., around a pocket 167 of the sealing portion 107), and an extensible wall portion 179 attached to the mounting flange 177 and extending into the pocket 167, within which the extensible wall portion 179 is attached to a drive plate 171.

With reference to FIG. 3E, each bracing actuator 173 may comprise a pressure cell 181 comprising a pocket 167 of the sealing portion 107 (see also FIG. 3B), a drive plate 171 of the bracing member 109, the extensible wall portion 179 of the drive plate bellows 175, and the mounting flange 177 (FIG. 3D) of the drive plate bellows 175. The pressure cell 181 may be expanded via an external source of pressurized gas (not shown) to force the bracing member 109 against the rear plate 119. For example, FIG. 3E illustrates a configuration of the chamber isolation valve 101a in which the sealing portion 107 of the closure member 103 is deployed against the front plate 121 of the valve housing 105, the bracing member 109 of the closure member 103 is deployed against the rear plate 119 of the valve housing 105, the extensible wall portion 179 of each drive plate bellows 175 is relatively compressed, and the volume of the pressure cell 181 is relatively large.

Alternatively, the pressure cell 181 may be contracted via an external source of vacuum pressure. For example, FIG. 3D illustrates a configuration of the chamber isolation valve 101a in which the bracing member 109 is retracted within a pocket 167 (FIG. 3B) of the sealing portion 107, the extensible wall portion 179 of the drive plate bellows 175 is relatively extended, and the volume of the pressure cell 181 (FIG. 3E) is relatively small. As will be explained further below, each bracing actuator 173 may comprise one such pressure cell 181 and may actuate (e.g., move/position/urge the bracing member 109) via changes in the volume of the pressure cell 181 and/or in the pressure (e.g., air pressure or fluid pressure) within the pressure cell 181.

Each bracing actuator 173 may be energized pneumatically. For example, each pocket 167 may be pneumatically coupled via a conduit 183 (FIG. 3B) that penetrates the walls of each of the pockets 167. Thus when the pressure cell 181 of one bracing actuator 173 of the closure member 103 is subjected to increased air or fluid pressure for expansion, or to vacuum pressure for contraction as the case may be, the pressure cell 181 of each bracing actuator 173 will tend to be similarly energized. As such the collective force exerted by the bracing actuators 173 may move the bracing member 109 relative to (e.g., toward or away from) the sealing portion 107, according to the pressure existing in the conduit 183.

Figure 3F:
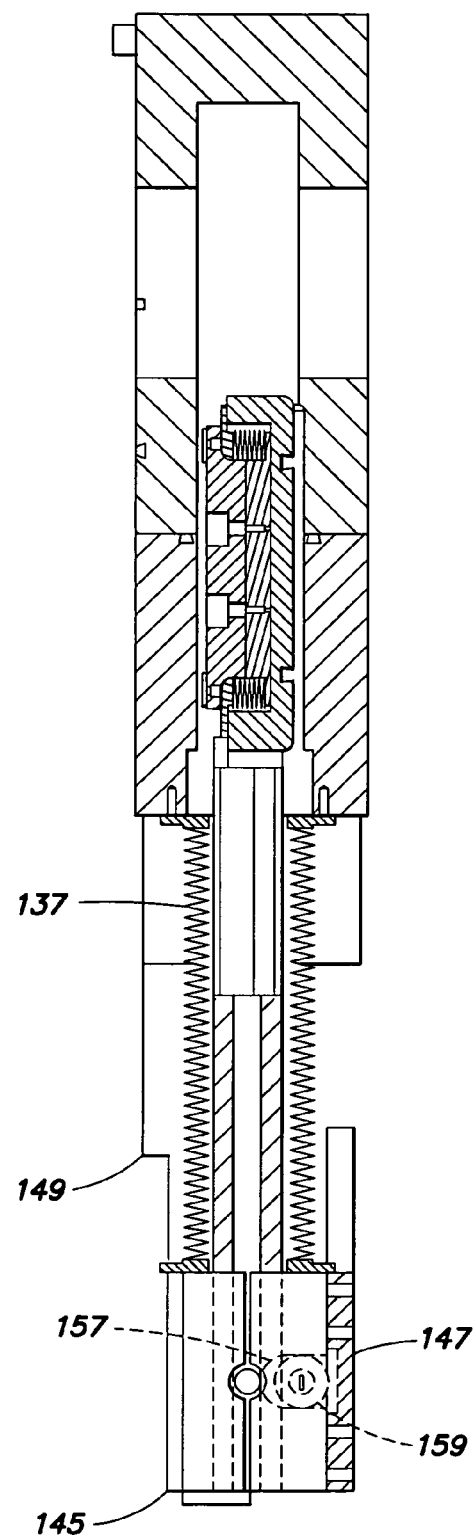

The closure member 103 may be adapted to expose the conduit 183 to a source of vacuum pressure (not shown) for retracting the bracing member 109 within the sealing portion 107, e.g., so as to prevent contact between the bracing member 109 and the valve housing 105 when the closure member 103 is in the longitudinally retracted position of FIG. 3F, or is being moved into or out of same. (The sealing portion 107 of the closure member 103 may be similarly retracted from the front plate 121). The closure member 103 may also be adapted to expose the conduit 183 to a source of pressurized gas (not shown) for extending the bracing member 109 away from the sealing portion 107 and/or to cause the bracing member 109, when fully extended, to push against the rear plate 119 of the valve housing 105 so as to brace the sealing portion 107 against the front plate 121 of the valve housing 105 as shown in FIG. 3E.

Exposure of the conduit 183 to a source of vacuum pressure or of pressurized gas can be accomplished in any of a number of ways. For example, one or both brackets 145 can include a socket 185 (FIG. 2) adapted to receive a pressure fitting (not shown), e.g., an end fitting of a pressure hose. The pressure fitting (not shown) may be adapted to mate with a pressure port 187 (FIG. 3E) formed within the extended portion 111 of the closure member 103 that is in communication with an extended conduit 189 (FIG. 3C) also formed within the extended portion 111 and leading to a sealing portion interface 191 (FIG. 3C) of the extended portion 111. The sealing portion interface 191 may be made to seal against an extended portion interface 193 of the sealing portion 107. A resilient element 195 may provide for a seal between the two interfaces. A feeder conduit 197 within the sealing portion 107 may lead from the extended portion interface 193 to the conduit 183 of the sealing portion 107. Such an arrangement provides a convenient means for pneumatically actuating the bracing actuators 173 of the closure member 103 and for exercising positive control (e.g., applying either vacuum or pressurized gas as necessary) over the position of the bracing member 109 relative to the sealing portion 107 (e.g., at all times). Other configurations for applying vacuum or pressurized gas to the bracing actuators 173 also may be employed.

It should also be noted that the extensible wall portions 179 of each of the drive plate bellows 175 are compressed during expansion of the pressure cells 181. Such an arrangement may subject the extensible wall portions 179 to less stress and fatigue than would be the case if the extensible wall portions 179 were expanded during pressure cell expansion, thus increasing the useful life of the drive plate bellows 175. The opposite arrangement may be employed.

It is further noted that in one embodiment each of the extended portions 111 of the closure member 103 may contact (see FIG. 3E) an inner surface 154 (FIG. 3D) of the first mounting flange 139 of an external bellows 137 as the sealing portion 107 of the closure member 103 contacts the front plate 121 of the valve housing 105. Such an arrangement may assist in providing a positive, self-aligning limit to the extent to which the closure member 103 moves toward the front plate 121 of the valve housing 105 (as described below). For instance, the position of the closure member 103 within the valve housing 105 when contact is established between the extended portion 111 and the first mounting flanges 139 may correspond to a desired initial degree of compression of a resilient sealing element (not shown) between the sealing portion 107 of the closure member 103 and the front plate 121, such that any further compression that may be required may be provided by the bracing member 109 bracing the sealing portion 107 against the front plate 121. In other embodiments, the extended portions 111 may remain out of contact with the inner surface 154 of the bellows 137 when the sealing portion 107 of the closure member 103 contacts the front plate 121.

Figure 4:
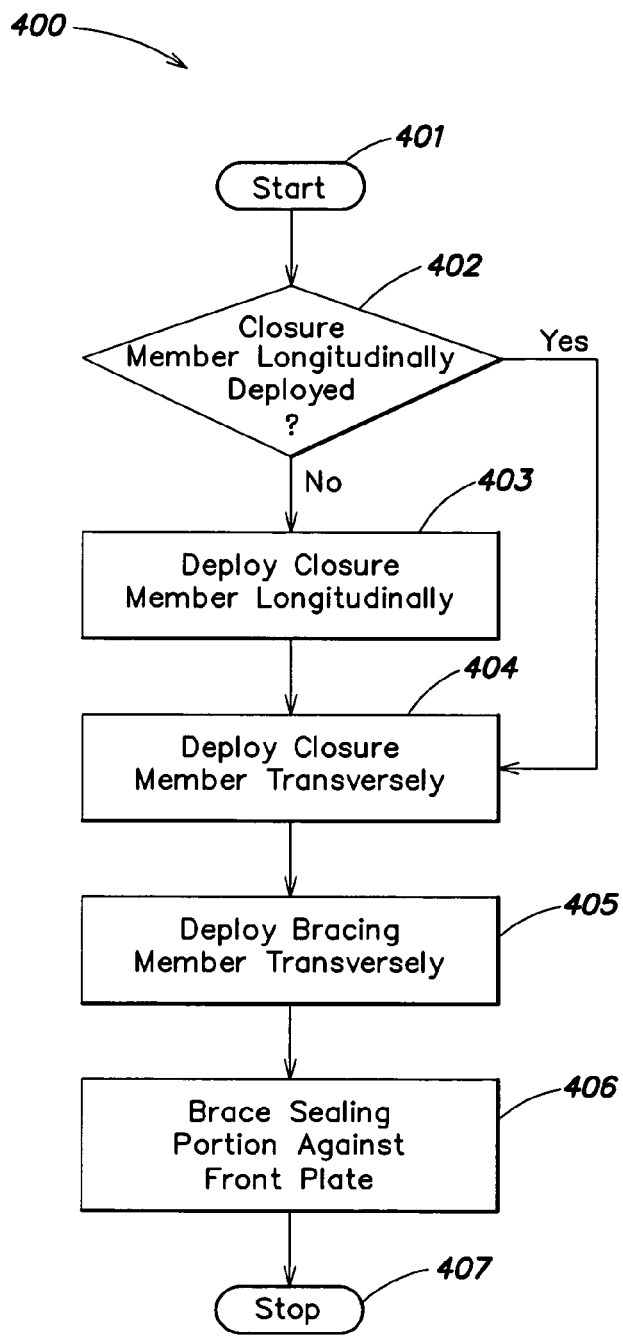
FIG. 4 is a flowchart that illustrates an exemplary process for sealing the first opening of the chamber isolation valve of FIG. 2.

FIG. 4 is a flowchart that illustrates an exemplary process 400 for sealing the first opening 115 of the chamber isolation valve 101a. Referring to FIG. 4, the process 400 may begin at a step 401. At a step 402, the process 400 either proceeds to a step 403 or a step 404 depending on the longitudinal position of the closure member 103 (FIG. 2). If the closure member 103 is in the longitudinally retracted position illustrated in FIG. 3F, the process 400 proceeds to step 403.

At the step 403, the closure member 103 is moved from the longitudinally retracted position of FIG. 3F to the longitudinally deployed position of the closure member 103 illustrated by FIG. 3D. For example, the first actuator 135 of the deployment mechanism 134 may be caused to elevate the closure member 103 from the longitudinally retracted position of FIG. 3F to the longitudinally deployed position of FIG. 3D. In one or more embodiments of the inventive method, before, during and/or after the above-described elevation of the closure member 103, the deployment mechanism 134 maintains the second gap 125 (FIG. 1A) and one or more of the bracing actuators 173 maintains the first gap 123 (FIG. 1A) between the closure member 103 and the valve housing 105 to protect against rubbing and/or particle generation during movement of the closure member 103. Accordingly, in some such embodiments, the second actuators 141 of the deployment mechanism 134 are actuated to retain the closure member 103 in a transversely retracted position away from the front plate 121 of the valve housing 105.

At the conclusion of the step 403, the closure member 103 will be in the vertically deployed position of FIG. 3D. As such, the process 400 proceeds to a step 404.

At the step 404, the closure member 103 is transversely deployed, e.g., is moved from the transversely retracted position of the closure member 103 of FIG. 3D to the transversely deployed position of the closure member 103 illustrated in FIG. 3E. For example, one or more of the second actuators 141 of the deployment mechanism 134 (and/or one or more of the bracing actuators 173) may be caused to move the closure member 103 from the transversely retracted position of the closure member 103 of FIG. 3D to the transversely deployed position of FIG. 3E. By deactivating (e.g., depressurizing) the second actuators 141, the extended portions 111 may be transversely movable, and expansion of one or more of the bracing actuators 173, spring biasing of the extended portions 111 or the closure member 103 or the like may move the sealing portion 107 toward the front plate 121. In one or more embodiments of the inventive method, the above transverse deployment of the closure member 103 results in the sealing portion 107 of the closure member 103 being moved into contact with the front plate 121 of the valve housing 105. In some such embodiments and/or in other embodiments, the above-described transverse deployment of the closure member 103 results in the extended portions 111 of the closure member 103 contacting corresponding inner surfaces 154 of the first mounting flanges 139 of the external bellows 137.

Proceeding to a step 405 of the process 400, the bracing member 109 of the closure member 103 is transversely deployed, e.g., is moved to a transversely deployed position of the bracing member 109 illustrated in FIG. 3E. For example, one or more of the bracing actuators 173 (FIG. 2) of the closure member 103 may be caused to move the bracing member 109 away from a transversely retracted position of the bracing member 109 against and/or within the sealing portion 107 (e.g., as illustrated in FIG. 3D), to the transversely deployed position of FIG. 3E.

In one or more embodiments of the inventive method, the step 405 begins only after the step 404 is complete. In other embodiments, the step 405 and the step 404 are performed simultaneously and/or both steps are begun before either is complete. In still further embodiments, the step 404 begins only after the step 405 has begun. Additionally, in one or more embodiments of the inventive method, before, during, and/or after the above-described transverse deployments of the closure member 103 and the bracing member 109 of the closure member 103, the deployment mechanism 134 is employed to maintain the closure member 103 in the longitudinally deployed position of the closure member 103 (FIG. 3E). For example, the first actuator 135 may remain activated after elevating the closure member 103 (see step 402).

Proceeding to a step 406 of the process 400, the sealing portion 107 is braced against the front plate 121 to seal the first opening 115 formed therein. For example, the pressure in the pressure cells 181 of each bracing actuator 173 may be increased from what may have been a relatively low pressure sufficient to move the bracing member 109 into place against the rear plate 119 (see the step 405) to a relatively high pressure commensurate with the anticipated magnitude of pressure forces to be exerted by the pressurized chamber P. Alternatively, if a pressure used to expand the pressure cells 181 in the step 405 is high enough to resist the anticipated pressure forces, or if the pressure was increased gradually or step-wise during the step 405 to an adequately high pressure, that same pressure may be maintained for as long as bracing force is required.

With the closure member 103 being both longitudinally and transversely deployed, the bracing member 109 being transversely deployed and the sealing portion 107 being braced against the front plate 121 so as to seal the first opening 115, the process 400 ends at a step 407.

The process 400 may alternatively begin with one or more steps to ensure that the first and second gaps 123, 125 between the closure member 103 and the valve housing 105 exist prior to the closure member 103 being longitudinally deployed (e.g., elevated) by the first actuator 135 of the deployment mechanism 134. For example, one or more of the bracing actuators 173 may be employed in a direction opposite the bracing direction, e.g., via the application of vacuum pressure, to ensure the bracing member 109 remains retracted against and/or within the sealing portion 107 (and away from the rear plate 119 of the valve housing 105) during longitudinal deployment of the closure member 103. Further, one or more of the second actuators 141 may be employed in a direction opposite the sealing direction, e.g., via the application of positive pressure (with movement in the sealing direction occurring, e.g., by the force of a biasing element, such as a coil spring (not shown) or by expansion of the pressure cells 181), to ensure the sealing portion 107 of the closure member 103 remains retracted away from the front plate 121 of the valve housing 105 during longitudinal deployment of the closure member 103.

Figure 5:
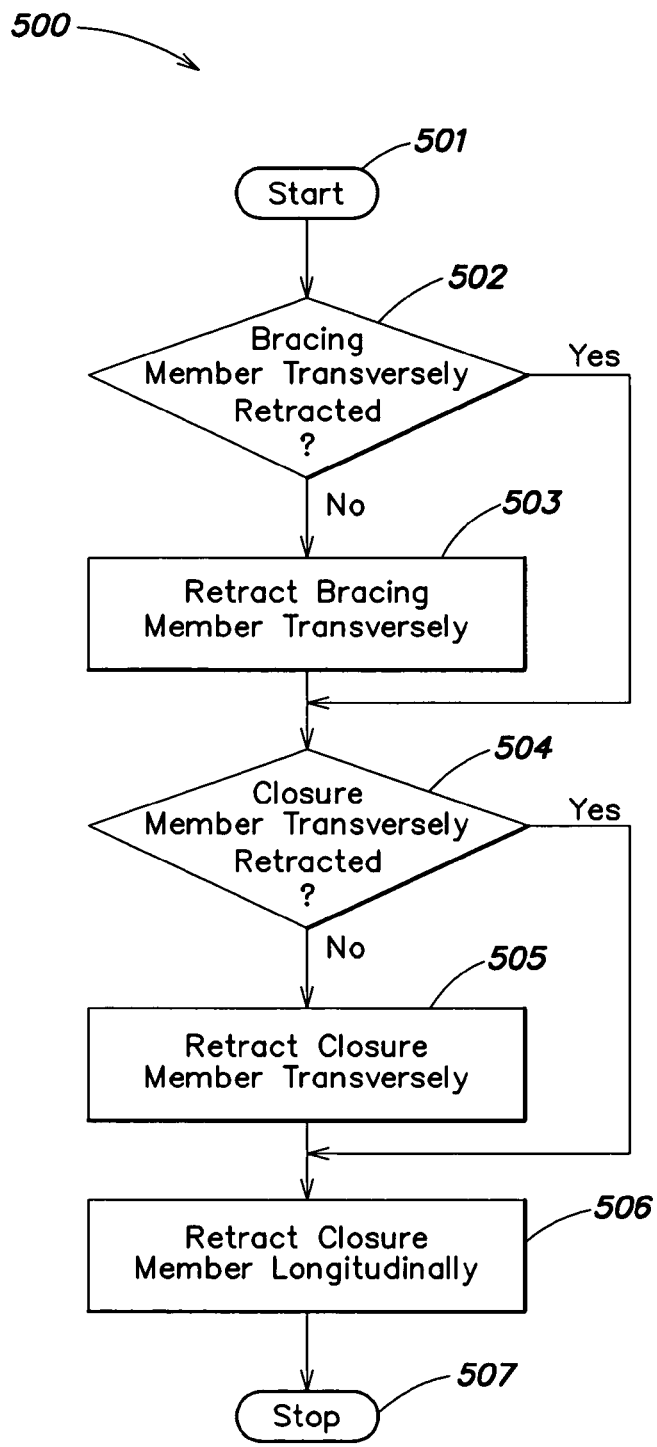
FIG. 5 is a flowchart that illustrates an exemplary process for placing the closure member of the chamber isolation valve of FIG. 2 in the longitudinally retracted position of the closure member shown in FIG. 3F.

FIG. 5 is a flowchart that illustrates an exemplary process 500 for placing the closure member 103 of the chamber isolation valve 101a in the longitudinally retracted position of the closure member 103 shown in FIG. 3F. Referring to FIG. 5, the process 500 may begin at a step 501. At a step 502, the process 500 either proceeds to a step 503 or a step 504 depending on the transverse position of the bracing member 109 (FIG. 2). If the bracing member 109 is not in a transversely retracted position, the process 500 proceeds to the step 503.

At the step 503, the bracing member 109 is transversely retracted, e.g., moved to a transversely retracted position such as is shown in FIG. 3D. For example, one or more of the bracing actuators 173 may be caused to move the bracing member 109 from a transversely deployed position of the bracing member 109, such as is shown in FIG. 3E, to the transversely retracted position as shown in FIG. 3D.

Proceeding to the step 504, the process 500 either proceeds to the step 505 or a step 506 depending on the transverse position of the closure member 103 (FIG. 2). If the closure member 103 is not in a transversely retracted position, the process 500 proceeds to step 505.

At the step 505, the closure member 103 is transversely retracted, e.g., moved to a transversely retracted position such as is shown in FIG. 3D. For example, one or more of the second actuators 141 may be caused to move the closure member 103 from a transversely deployed position of the closure member 103, such as is shown in FIG. 3E, to the transversely retracted position as shown in FIG. 3D.

In one or more embodiments of the process 500, two or more of the steps 502, 503, 504 and 505 may occur simultaneously or in a different order. Additionally, the step 505 need not begin only after the step 503 is complete. Also, in one or more embodiments of the process 500, before, during and after the retraction of either or both the bracing member 109 and the closure member 103, the deployment mechanism 134 may be employed to actively retain the closure member 103 in the vertically deployed position of the closure member 103 (FIG. 3E). For example, the first actuator 135 of the deployment mechanism 134 may be continuously activated for this purpose.

Proceeding to the step 506, the closure member 103 is moved to the longitudinally retracted position of the closure member 103 as shown in FIG. 3F. For example, the first actuator 135 of the deployment mechanism 134 may be caused to move the closure member 103 from the longitudinally deployed position as shown in FIG. 3D to the longitudinally retracted position shown in FIG. 3F. In one or more embodiments of the process 500, before, during, and/or after the above-described retraction of the closure member 103, the deployment mechanism 134 and one or more of the bracing actuators 173 may maintain the first and second gaps 123, 125 (FIG. 1A) between the closure member 103 and the valve housing 105 to protect against rubbing and/or particle generation during longitudinal movement of the closure member 103. For example, in some such embodiments, the second actuators 141 may be prevented from moving the closure member 103 transversely toward the front plate 121 of the valve housing 105. Additionally, in one or more embodiments the bracing actuators 173 may be prevented from moving the bracing member 109 transversely toward the rear plate 119 of the valve housing 105. As well, in one or more embodiments, one or more of the bracing actuators 173 may be activated, e.g., via application of vacuum pressure, to maintain a retracted position of the bracing member 109 against/within the sealing portion 107 during longitudinal retraction of the closure member 103.

The closure member 103 being both longitudinally and transversely retracted, the chamber isolation valve 101a is now configured to permit passage of substrates back and forth through the valve housing 105 of the chamber isolation valve 101a, and the process 500 ends at a step 507. Where it is advantageous or desirable, additional steps may be taken to ensure the closure member 103 remains spaced apart from the valve housing 105, even when retracted and not moving. For example, one or more of the bracing actuators 173 and/or one or more of the second actuators 141 may be continuously activated to maintain the first and/or second gaps 123, 125 (FIG. 1A).

As relates to the processes 400, 500 of FIGS. 4 and 5, in some embodiments of the chamber isolation valve 101a, the first actuator 135 is adapted to actuate via the application of positive pressure during both longitudinal deployment and longitudinal retraction of the closure member 103. In some other embodiments of the chamber isolation valve 101a, the first actuator 135 may be adapted to actuate via positive pressure during longitudinal deployment with gravity being employed for vertical retraction. In further embodiments of the chamber isolation valve 101a, each bracing actuator 173 may be adapted to actuate via a spring default during transverse deployment of the closure member 103, and in some such embodiments each second actuator 141 may be adapted to actuate via positive pressure during transverse retraction of the closure member 103 (e.g., for assurance of maintaining a transverse retraction of the closure member 103 during longitudinal movement of the closure member 103). In still further embodiments of the chamber isolation valve 101a, each bracing actuator 173 may be adapted to actuate via positive pressure during transverse deployment of the bracing member 109 and via vacuum pressure (e.g., no spring default) during transverse retraction of the bracing member 109 (e.g., to avoid having to overcome the force of a spring default when deploying the bracing member 109). Other configurations may be employed.

Figure 6:
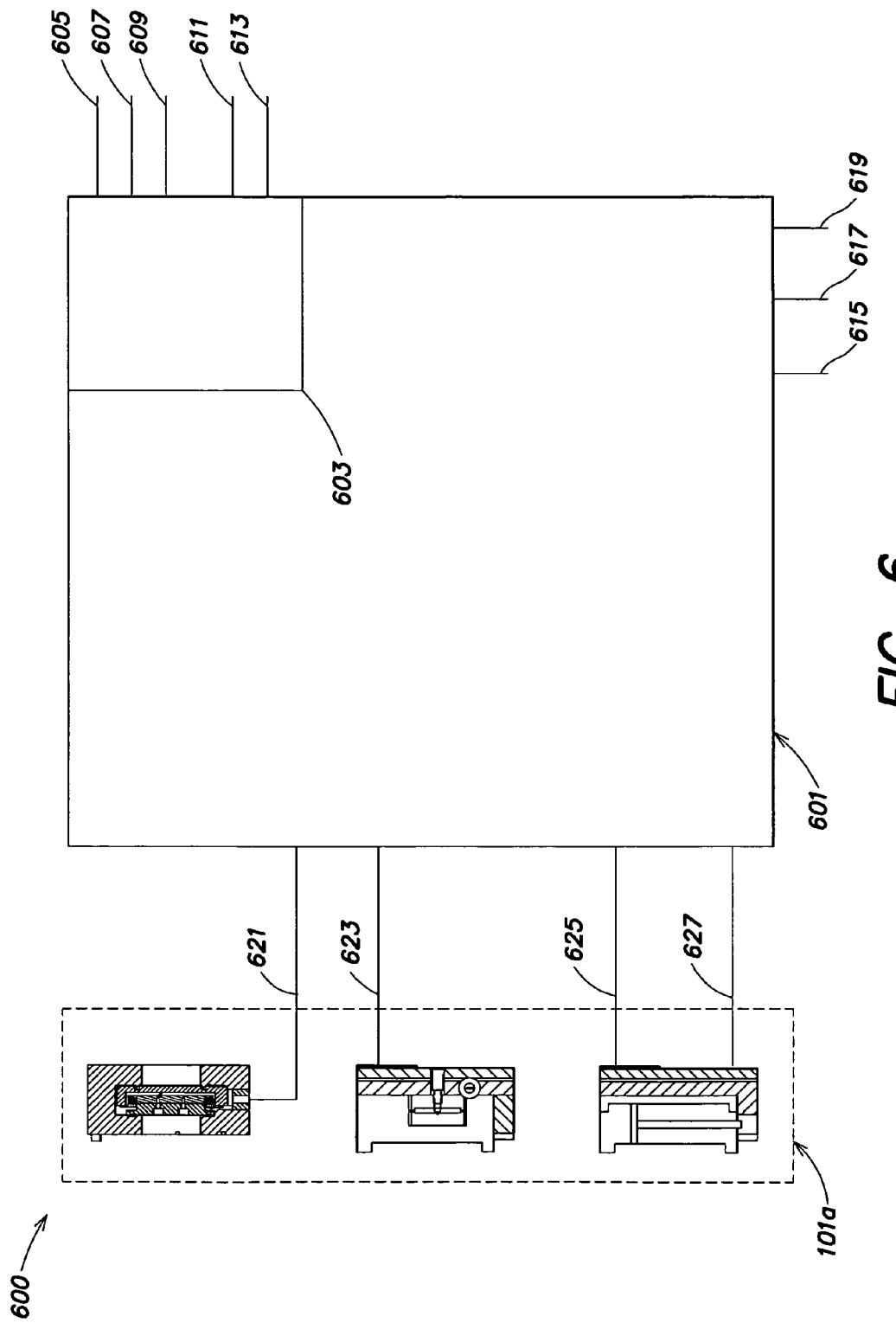
FIG. 6 is a schematic representation of a slit valve system including the chamber isolation valve of FIG. 2 and a slit valve control module adapted to operate and/or coordinate functions of the chamber isolation valve.

FIG. 6 is a schematic representation of a slit valve system 600 including the chamber isolation valve 101a of FIG. 2 and a slit valve control module 601 adapted to operate and/or coordinate functions of the chamber isolation valve 101a. For example, the slit valve control module 601 may be adapted to interact with the chamber isolation valve 101a so as to perform the process 400 illustrated by the flow chart of FIG. 4 and/or the process 500 illustrated by the flow chart of FIG. 5.

The slit valve control module 601 may comprise an input/output module 603 adapted to generate and/or receive signals. For example, the input/output module 603 may be adapted to:

(1) determine whether the closure member 103 is in a longitudinally retracted position as illustrated in FIG. 3F;

(2) generate and transmit an electrical signal along a first signal conductor 605 corresponding to the closure member 103 being in the longitudinally retracted position of FIG. 3F;

(3) illuminate an indicator light (e.g., a green L.E.D.) corresponding to the closure member 103 being in the longitudinally retracted position of FIG. 3F;

(4) determine whether the closure member 103 is in a longitudinally deployed position as illustrated in FIG. 3D;

(5) generate and transmit an electrical signal along a second signal conductor 607 corresponding to the closure member 103 being in the longitudinally deployed position of FIG. 3D;

(6) illuminate an indicator light (e.g., a red L.E.D.) corresponding to the closure member 103 being in the longitudinally deployed position of FIG. 3D;

(7) determine whether the bracing member 109 is in a transversely deployed position as illustrated on FIG. 3E;

(8) generate and transmit an electrical signal along a third signal conductor 609 corresponding to the bracing member 109 being in the transversely deployed position of FIG. 3E;

(9) prevent the signal (5) above from being generated and transmitted, and the indicator light of (6) above from being illuminated, until the bracing member 109 has been determined to be in a transversely deployed position as in (7) above;

(10) receive an electrical signal along a fourth signal conductor 611, e.g., so as to cause and/or permit the slit valve control module 601 to operate the chamber isolation valve 101*a* so as to perform the process 400 described above with reference to FIG. 4 (e.g., seal the first opening 115 of the chamber isolation valve 101*a* as illustrated in FIG. 3E);

(11) receive an electrical signal along a fifth signal conductor 613, e.g., so as to cause and/or permit the slit valve control module 601 to operate the chamber isolation valve 101*a* so as to perform the process 500 described above with reference to FIG. 5 (e.g., place the closure member 103 in the longitudinally retracted position of the closure member 103 as illustrated in FIG. 3F);

(12) control and direct power to one or more pneumatic switches of the slit valve control module 601 (not shown) adapted to selectively reconfigure connections between and/or among a plurality of pneumatic conduits having a connection to the slit valve control module 601, such as:
 (a) a vacuum source conduit 615;
 (b) a pressurized gas source conduit 617;
 (c) an ambient (atmospheric) exhaust conduit 619;
 (d) a brace actuation conduit 621;
 (e) a clamp actuation conduit 623;
 (f) a closure member lowering conduit 625;
 (g) a closure member elevating conduit 627;

(13) detect the presence of elevated pressure (e.g., pressurization) in the brace actuation conduit 621;

(14) perform the function of (7) above at least in part via the function of (13) above; and/or

(15) detect the presence of depressed pressure (e.g., vacuum) in the brace actuation conduit 621.

The slit valve control module 601 may also be adapted to perform the following functions:

(16) selectively connecting the pressurized gas source conduit 617 to the brace actuation conduit 621, e.g., so as to actuate each bracing actuator 173 and thereby move the bracing member 109 into the transversely deployed position illustrated in FIG. 3E;

(17) selectively connecting the vacuum source conduit 615 to the brace actuation conduit 621, e.g., so as to actuate each bracing actuator 173 and thereby move the bracing member 109 into the transversely retracted position illustrated in FIG. 3D;

(18) positively preventing the function of (17) above from occurring while the pneumatic connection of (16) above exists;

(19) positively preventing the function of (16) above from occurring while the pneumatic connection of (17) above exists;

(20) selectively connecting the pressurized gas source conduit 617 to the clamp actuation conduit 623, e.g., so as to actuate each second actuator 141 of the deployment mechanism 134 and thereby move the closure member 103 into the transversely retracted position illustrated in FIG. 3D (e.g., by defeating a spring default tending to deploy the closure member 103);

(21) selectively connecting the ambient exhaust conduit 619 to the clamp actuation conduit 623, e.g., so as to cease actuating each second actuator 141 of the deployment mechanism 134 and to allow a spring default (e.g., built into each deployment mechanism 134) or action of the bracing actuators 173 to dominate, thereby moving the closure member 103 into the transversely deployed position illustrated in FIG. 3E;

(22) selectively connecting the pressurized gas source conduit 617 to the closure member lowering conduit 625, e.g., so as to actuate the first actuator 135 (FIG. 3A) and thereby move the closure member 103 into the longitudinally retracted position illustrated in FIG. 3F;

(23) selectively connecting the ambient exhaust conduit 619 to the closure member elevating conduit 627, e.g., so as to facilitate the function of (22) above;

(24) selectively connecting the pressurized gas source conduit 617 to the closure member elevating conduit 627, e.g., so as to actuate the first actuator 135 (FIG. 3A) and thereby move the closure member 103 into the longitudinally deployed position illustrated in FIG. 3D;

(25) selectively connecting the ambient exhaust conduit 619 to the closure member lowering conduit 625, e.g., so as to facilitate the function of (24) above;

(26) simultaneously performing (22) and (23) above;
(27) simultaneously performing (24) and (25) above;
(28) selectively switching from (26) above to (27) above;
(29) selectively switching from (27) above to (26) above;
(30) simultaneously performing (17) and (20) above;
(31) simultaneously performing (16) and (21) above;
(32) selectively switching from (30) above to (31) above;
(33) selectively switching from (31) above to (30) above;
(34) positively preventing (16) and (21) from occurring while the pneumatic connection of (22) exists;

(35) positively preventing (16) and (21) from occurring unless the closure member 103 is in the vertically deployed position illustrated in FIG. 3D;

(36) positively preventing (28) and (29) above from occurring unless the pneumatic connection of (17) above exists;

(37) defaulting to (31) upon loss of power to the slit valve control module 601;

(38) performing the process 400 of FIG. 4 by performing (28), (27), (35), (16), (21) and (36) above;

(39) performing the process 400 of FIG. 4 by performing (28), (27), (35), (16), (21), (36), (32) and (31) above;

(40) performing the process 500 of FIG. 5 by performing (36), (20), (17), (29), (22), (23), (26), and (34) above; and/or

(41) performing the process 500 of FIG. 5 by performing (36), (33), (20), (17), (29), (23), (26), (34), and (30) above.

Numerous other functions also or alternatively may be performed.

Figure 7:
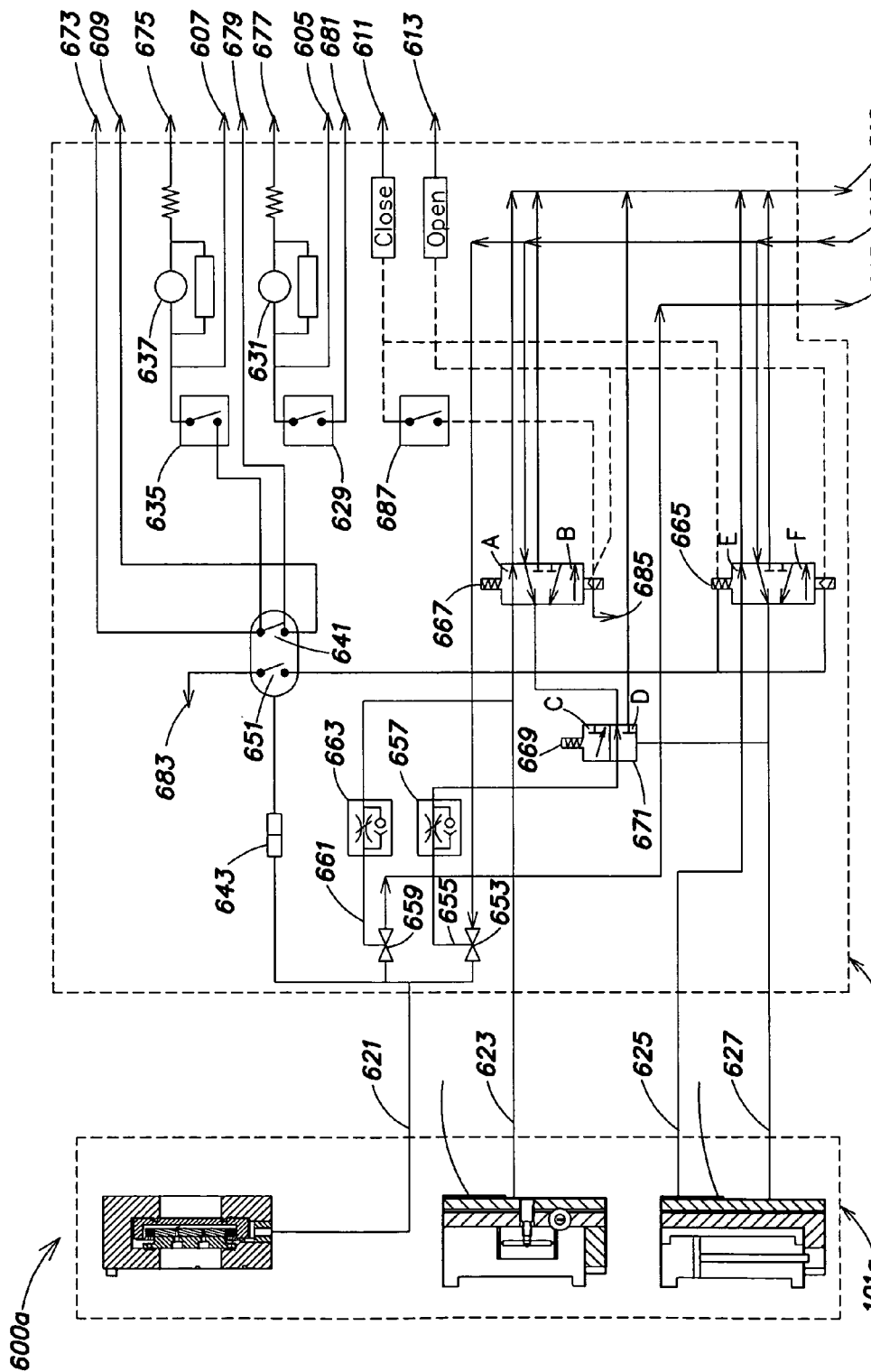
FIG. 7 is a schematic representation of a particular embodiment of the slit valve system of FIG. 6.

FIG. 7 is a schematic representation of a particular embodiment 600*a* of the slit valve system 600 of FIG. 6 comprising the chamber isolation valve 101*a* of FIG. 2 and a particular embodiment 601*a* of the slit valve control module 601, wherein the slit valve control module 601*a* is shown in more detail. Referring to FIG. 7, the slit valve control module 601*a* is adapted to perform the functions 1–41 as described above. The aspects/structure of the slit valve control module 601*a* adapted to perform those functions will be introduced and explained in the general order of the functions.

Functions 1–3 may be encompassed in a first position switch 629, a first indicator light 631, and the first signal conductor 605. The first position switch 629 may be configured so as to be normally open, and may be installed within or adjacent the chamber isolation valve 101*a* such that it is actuated or closed when the closure member 103 reaches the FIG. 3F longitudinally retracted position. The first indicator light 631 can be a signal to a human operator. The first signal conductor 605 can carry a signal to a remote controller (not shown). Other uses for the first indicator light 631 and/or the first signal conductor 605 are possible.

Functions 4–6 may by similarly encompassed in a second position switch 635, a second indicator light 637, and the second signal conductor 607. The second position switch 635 may be configured so as to be normally open, and may be installed within or adjacent the chamber isolation valve 101*a* such that it is actuated or closed when the closure member 103 reaches the FIG. 3D longitudinally deployed position. The second indicator light 637 and the second signal conductor 607 may function similarly to the first indicator light 631 and the first signal conductor 605.

Function 7 may be encompassed in pressure switch 641. The pressure switch 641 may be configured so as to be normally open, and may be pneumatically coupled to the brace actuation conduit 621 (e.g., via an orifice 643 adapted to slowly equalize pressure on either side of the orifice 643) so as to be actuated or closed when the brace actuation conduit 621 is at positive pressure compared to ambient pressure. Since positive pressure in the brace actuation conduit 621 leads to transverse deployment of the bracing member 109 via actuation of each bracing actuator 173, and the orifice 643 may be actuated so as to equalize pressure only after the bracing member 109 has deployed, the pressure switch 641 may perform function 7.

Functions 8 and 9 may be encompassed by the third signal conductor 609 and the fact that the pressure switch 641 must be closed for the second indicator light 637 to light up or for the third signal conductor 609 to receive power.

Functions 10 and 11 may be encompassed by the fourth signal conductor 611 and the fifth signal conductor 613 respectively.

Function 12 may be encompassed by the fourth signal conductor 611 and the fifth signal conductor 613, which may be adapted to receive a signal (e.g., in the form of +24V or another power level signal), as described below.

Function 13 may be encompassed in the pressure switch 641, and function 14 is self-explanatory.

Function 15 may be encompassed in a vacuum switch 651. The vacuum switch 651 may be configured so as to be normally open, and may be pneumatically coupled to the brace actuation conduit 621 (e.g., via the orifice 643) so as to be actuated or closed when the brace actuation conduit 621 is at vacuum pressure compared to the ambient.

Function 16 may be encompassed in a master pressure source valve 653. The master pressure source valve 653 may be configured so as to be normally closed, and may connect the brace actuation conduit 621 with the pressurized gas source conduit 617. The master pressure source valve 653 may be further configured so as to be actuated or opened when exposed at an actuation port to positive pressure via a pneumatic conduit 655. The pneumatic conduit 655 may be selectively connected either to the pressurized gas source conduit 617 or the ambient exhaust conduit 619 via a first flow regulator 657 (as well as through a pair of pneumatic switching connectors as will be explained below).

Function 17 may be encompassed in a master vacuum source valve 659. The master vacuum source valve 659 may be configured so as to be normally closed, and may connect the brace actuation conduit 621 with the vacuum source conduit 615. The master vacuum source valve 659 may be further configured so as to be actuated or opened when exposed at an actuation port to positive pressure via a pneumatic conduit 661. The pneumatic conduit 661 may be selectively connected either to the pressurized gas source conduit 617 or the ambient exhaust conduit 619 via a second flow regulator 663 (as well as through a pneumatic switching connector as will be explained below).

The slit valve control module 601*a* may comprise a first pneumatic switching connector 665, a second pneumatic switching connector 667, and a third pneumatic switching connector 669, all adapted to participate in the interface described in the above described function 12. The first pneumatic switching connector 665 and the second pneumatic switching connector 667 are adapted to establish and selectively vary the pneumatic connection configuration between and/or among five separate pneumatic conduits (two of which are always common with the ambient exhaust conduit 619, and one of which is always common with the pressurized gas source conduit 617), and the second pneumatic switching connector 667 is adapted to establish and selectively vary the pneumatic connection configuration between three separate pneumatic conduits (one of which is always common with the ambient exhaust conduit 619).

The second pneumatic switching connector 667 is adapted to assume pneumatic configuration A by default, wherein the default mechanism may be, e.g., a spring, and is adapted to selectively assume pneumatic configuration B, e.g., via high-side voltage being applied to an actuation coil adapted to shift pneumatic configuration B into the position occupied by configuration A as shown in FIG. 7. The third pneumatic switching connector 669 is adapted to assume pneumatic configuration C by default, wherein the default mechanism may be, e.g., a spring, and is adapted to selectively assume pneumatic configuration D as shown in FIG. 7, e.g., via positive pressure being applied to a pneumatic actuation mechanism 671 and the pneumatic actuation mechanism 671 thereby actuating so as to shift pneumatic configuration D into the position shown (e.g., moving configuration C out and moving configuration D in). The first pneumatic switching connector 665 is adapted to selectively assume either pneumatic configuration E, as shown in FIG. 7, or pneumatic configuration F, e.g., via two different high-side conductors (e.g., of +24V) being applied to respective actuation coils that are adapted to move the first pneumatic switching connector 665 from configuration E to configuration F, or from configuration F to configuration E, as the case may be.

The slit valve control module 601a may further include additional high-side voltage conductors 673, 675 and 677, return or ground conductors 679, 681, 683 and 685, and a third position switch 687. The third position switch 687 may be configured so as to be normally closed, and may be installed within or adjacent the chamber isolation valve 101a such that it is actuated or opened when the closure member 103 reaches the FIG. 3D longitudinally deployed position.

It will be apparent to those skilled in the art upon reading the present application and reviewing the figures of the present application, especially FIG. 7, that the slit valve control module 601a is adapted to perform the above-described functions 16–41 via selectively receiving a high-side voltage signal along the fourth signal conductor 611 or the fifth signal conductor 613, and permitting the remaining elements of the slit valve control module 601a to function as described above according to the schematic of FIG. 7. For example, the master vacuum source valve 659 and the master pressure source valve 653 are adapted to open in a mutually exclusive manner, preventing the simultaneous application of vacuum pressure and positive pressure to the brace actuation conduit 621 and each bracing actuator 173. As well, the circuits between the fourth signal conductor 611 and the return or ground conductor 683, and between the fifth signal conductor 613 and the return or ground conductor 683, are incapable of being closed unless and until the brace actuation conduit 621 is being exposed to vacuum pressure via the master vacuum source valve 659, and the vacuum switch 651 is thereby closed (this permits switching from configuration E to configuration F, or vice versa, in the first pneumatic switching connector 665). Additionally, the third pneumatic switching connector 669 may not assume configuration D unless positive pressure is received at the pneumatic actuation mechanism 671, and the latter is not possible unless the first pneumatic switching connector 665 is in configuration E as shown. Still further, the third position switch 687, shown open in FIG. 7, is normally closed, causing the second pneumatic switching connector 667 to remain in configuration B (resulting in vacuum pressure being applied to the brace actuation conduit 621 and the bracing member 109 to remain in the transversely retracted position of FIG. 3F) until the closure member 103 reaches the longitudinally deployed position of FIG. 3D, at which time the third position switch 687 opens, triggering the spring default of the second pneumatic switching connector 667, and causing the second pneumatic switching connector 667 to switch to configuration A. Other configurations/systems for controlling the inventive valve 101, 101a may be employed.

The foregoing description discloses only exemplary embodiments of the invention. Modifications of the above disclosed apparatus and methods which fall within the scope of the invention will be readily apparent to those of ordinary skill in the art. For instance, according to one or more embodiments, pressure forces within the processing chamber P tending to push the sealing portion 107 away from the processing chamber P may be opposed solely by bracing force generated by the bracing actuators 173. In other embodiments, the magnitude of the bracing force may be less than that required to oppose the pressure forces within the processing chamber P, and additional forces from other sources may be added thereto to maintain a seal against the processing chamber opening 102.

In at least one embodiment of the invention, the main body of the sealing portion 107 may be formed from a metal, such as aluminum or the like. In such embodiments, the sealing portion 107 may include a resilient member 198 (FIG. 3E) that contacts the front plate 121 and prevents metal portions of the sealing portion 107 from contacting the front wall 121 (e.g., so as to prevent particle generation from metal-to-metal contact). The resilient member 198 may include, for example, polyetheretherketone (PEEK) or another suitable material (e.g., in the form of an o-ring or similar sealing member). Likewise, in at least one embodiment, the main body of the bracing member 109 may be formed from a metal, such as aluminum or another suitable metal, and include a resilient member 199 (FIG. 3E) that contacts the back plate 119 (to prevent particle generation from metal-to-metal contact). The resilient member 199 may include, for example, polyetheretherketone (PEEK) or another suitable material (e.g., in the form of an o-ring or similar sealing member). It will be understood that as used herein, the sealing portion 107 may be said to contact the front plate 121 if its resilient member 198 or any other portion of the sealing portion 107 contacts the front plate 121. Likewise, the bracing member 109 may be said to contact the rear plate 119 if its resilient member 199 or any other portion of the bracing member 109 contacts the rear plate 119.

In at least one embodiment of the invention, the bellows 137 and/or the extensible wall portion 179 may be formed of stainless steel. Any other similar material may be employed.

Accordingly, while the present invention has been disclosed in connection with exemplary embodiments thereof, it should be understood that other embodiments may fall within the spirit and scope of the invention, as defined by the following claims.

The invention claimed is:

1. A slit valve adapted to seal an opening comprising:
   a valve housing having:
      a first wall;
      a first opening formed in the first wall;
      a second wall; and
      a second opening formed in the second wall;
   a closure member having:
      a sealing portion adapted to contact the second wall and seal the second opening; and
      a bracing member moveable relative to the sealing portion and adapted to contact the first wall; and
   at least one actuating mechanism adapted to:
      move the sealing portion toward the second wall and into contact with the second wall; and
      move the bracing member away from the sealing portion and into contact with the first wall so as to brace the sealing portion against the second wall;
      wherein the at least one actuating mechanism includes a bellows oriented such that movement of the bracing member away from the sealing portion produces a contraction of the bellows.

2. The slit valve of claim 1, wherein the at least one actuating mechanism includes an actuator that comprises a portion of the closure member and is disposed between the bracing member and the sealing portion.

3. The slit valve of claim 1, wherein the sealing portion includes a resilient element adapted to contact and seal against the second wall.

4. The slit valve of claim 1, wherein the bracing member includes a resilient element adapted to contact the first wall.

5. The slit valve of claim 1, wherein the bracing member is adapted to assume a retracted transverse position within the sealing portion.

6. The slit valve of claim 1, wherein the at least one actuating mechanism comprises a pneumatic actuator adapted to be selectably activated via positive pressure and vacuum pressure.

7. The slit valve of claim 6, wherein the pneumatic actuator is adapted to employ positive pressure to move the bracing member from a retracted transverse position against the sealing portion to a deployed transverse position against the first wall.

8. The slit valve of claim 6, wherein the pneumatic actuator is adapted to employ vacuum pressure to move the bracing member from a deployed transverse position against the first wall to a retracted transverse position against the sealing member.

9. The slit valve of claim 1, wherein the at least one actuating mechanism includes a pneumatic actuator comprising a pressure cell.

10. The slit valve of claim 9, wherein a portion of the bracing member defines a boundary of the pressure cell.

11. The slit valve of claim 9, wherein a portion of the sealing portion defines a boundary of the pressure cell.

12. The slit valve of claim 10, wherein the bellows also defines a boundary of the pressure cell.

13. The slit valve of claim 12, wherein the bracing member is coupled to the sealing portion via the bellows.

14. The slit valve of claim 13, wherein no coupling between the bracing member and the sealing portion exists except via the bellows.

15. The slit valve of claim 12, wherein the bellows is oriented such that an expansion of the pressure cell produces contraction of the bellows.

16. The slit valve of claim 12, wherein the bracing member comprises a plate, and wherein the plate also defines a boundary of the pressure cell.

17. The slit valve of claim 16, wherein the bracing member is adapted to assume a retracted transverse position away from the first wall such that the plate of the bracing member is within the sealing portion.

18. The slit valve of claim 16, wherein the bracing member is adapted to assume a deployed transverse position against the first wall such that the plate of the bracing member remains within the sealing portion.

19. The slit valve of claim 1, wherein the at least one actuating mechanism includes a first actuating mechanism that is external to the slit valve housing.

20. The slit valve of claim 19, wherein the first actuating mechanism comprises a pneumatic actuator adapted to be activated via positive pressure.

21. The slit valve of claim 20, wherein the pneumatic actuator is adapted to employ positive pressure to move the closure member so as to move the sealing portion from a deployed transverse position against the second wall to a retracted transverse position between the first and second walls.

22. The slit valve of claim 1, further comprising an additional actuating mechanism for moving the closure member such that the sealing portion moves between a retracted longitudinal position away from the first and second openings and a deployed longitudinal position between the first and second openings.

23. The slit valve of claim 22, wherein the additional actuating mechanism is external to the valve housing.

24. The slit valve of claim 22, wherein the additional actuating mechanism comprises a pneumatic actuator adapted to be activated via positive pressure.

25. The slit valve of claim 24, wherein the pneumatic actuator is adapted to employ positive pressure to move the closure member so as to move the sealing portion from the retracted longitudinal position to the deployed longitudinal position of the sealing portion.

26. The slit valve of claim 25, wherein the pneumatic actuator is further adapted to employ positive pressure to move the closure member so as to move the sealing portion from the deployed longitudinal position to the retracted longitudinal position of the sealing portion.

27. A method of sealing an opening of a slit valve housing comprising:
   providing a valve housing having:
      a first wall;
      a first opening formed in the first wall;
      a second wall; and
      a second opening formed in the second wall;
   providing a closure member having:
      a sealing portion adapted to contact the second wall and seal the second opening; and
      a bracing member moveable relative to the sealing portion and adapted to contact the first wall;
   moving the sealing portion toward the second wall and into contact with the second wall; and
   moving the bracing member away from the sealing portion and into contact with the first wall so as to brace the sealing portion against the second wall, wherein moving the bracing member away from the sealing portion comprises compressing a bellows.

28. The method of claim 27, wherein the first and second openings are transversely aligned.

29. The method of claim 28, wherein moving the sealing portion comprises moving the closure member transversely.

30. The method of claim 28, wherein moving the bracing member away from the sealing portion comprises moving the bracing member transversely.

31. The method of claim 28, further comprising longitudinally moving the closure member so as to cause the bracing member and the sealing portion to move into transverse alignment with the openings.

32. The method of claim 31, wherein longitudinally moving the closure member comprises:
   preventing the sealing portion from contacting the second wall; and
   preventing the bracing member from contacting the first wall.

33. A slit valve adapted to seal an opening comprising:
   a valve housing having:
      a first wall;
      a first opening formed in the first wall;
      a second wall; and
      a second opening formed in the second wall;
   a closure member having:
      a sealing portion adapted to contact the second wall and seal the second opening, and
      a bracing member that includes a plate that defines a boundary of a pressure cell, the bracing member being moveable relative to the sealing portion and adapted to contact the first wall, wherein the bracing member is adapted to assume a retracted transverse position away from the first wall such that the plate of the bracing member is within the sealing portion; and
   at least one actuating mechanism adapted to:
      move the sealing portion toward the second wall and into contact with the second wall; and
      move the bracing member away from the sealing portion and into contact with the first wall so as to brace the sealing portion against the second wall.

34. A slit valve adapted to seal an opening comprising:
a valve housing having:
- a first wall;
- a first opening formed in the first wall;
- a second wall; and
- a second opening formed in the second wall;

a closure member having:
- a sealing portion adapted to contact the second wall and seal the second opening; and
- a bracing member that includes a plate that defines a boundary of a pressure cell, the bracing member being moveable relative to the sealing portion and adapted to contact the first wall, wherein the bracing member is adapted to assume a deployed transverse position against the first wall such that the plate of the bracing member remains within the sealing portion; and at least one actuating mechanism adapted to:
- move the sealing portion toward the second wall and into contact with the second wall; and
- move the bracing member away from the sealing portion and into contact with the first wall so as to brace the sealing portion against the second wall.

* * * * *